(12) United States Patent
Yamamoto et al.

(10) Patent No.: US 7,808,155 B2
(45) Date of Patent: Oct. 5, 2010

(54) MONOLITHIC PIEZOELECTRIC ELEMENT

(75) Inventors: Atsushi Yamamoto, Yasu (JP); Koji Ogiso, Moriyama (JP); Koichi Hayashi, Kusatsu (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 12/478,199

(22) Filed: Jun. 4, 2009

(65) Prior Publication Data

US 2009/0236945 A1 Sep. 24, 2009

Related U.S. Application Data

(63) Continuation of application No. PCT/JP2007/070991, filed on Oct. 29, 2007.

(30) Foreign Application Priority Data

Dec. 6, 2006 (JP) ............................. 2006-329141

(51) Int. Cl.
H01L 41/083 (2006.01)
(52) U.S. Cl. ..................... 310/328; 310/363; 310/364; 310/365
(58) Field of Classification Search ................. 310/328, 310/358, 363–366
See application file for complete search history.

(56) References Cited

U.S. PATENT DOCUMENTS

| | | | |
|---|---|---|---|
| 5,935,485 A * | 8/1999 | Tani et al. | 252/62.9 PZ |
| 5,958,285 A * | 9/1999 | Kawano et al. | 252/62.9 R |
| 7,332,851 B2 * | 2/2008 | Nanataki et al. | 310/358 |
| 7,344,654 B2 * | 3/2008 | Ogiso et al. | 252/62.9 PZ |
| 7,431,785 B2 * | 10/2008 | Horikawa et al. | 156/89.14 |
| 7,595,006 B2 * | 9/2009 | Yamamoto et al. | 252/62.9 PZ |
| 7,598,660 B2 * | 10/2009 | Kobayashi et al. | 310/366 |

(Continued)

FOREIGN PATENT DOCUMENTS

JP 8-288607 11/1996

(Continued)

OTHER PUBLICATIONS

PCT/JP2007/070991 International Search Report dated Aug. 11, 2007.
PCT/JP2007/070991 Written Opinion dated Aug. 11, 2007.

*Primary Examiner*—J. SanMartin
(74) *Attorney, Agent, or Firm*—Dickstein, Shapiro, LLP.

(57) ABSTRACT

A monolithic piezoelectric element includes an element assembly in which internal electrode layers and piezoelectric ceramic layers are laminated alternately. The internal electrode layers contain an Ag—Pd alloy, which has an Ag content of 85 percent by weight or more as a primary component, a metal element having a valence of at least one of pentavalence or hexavalence. The piezoelectric ceramic layers contain a composite oxide represented by $Pb(Ti,Zr)O_3$ as a primary component, a part of Ag contained in the internal electrode layers is almost uniformly diffused therein and, the metal element is diffused in the form of a metal oxide in such a way that the concentration is reduced with decreasing proximity to the internal electrode layers. In this manner, a monolithic piezoelectric element having a desired large piezoelectric constant can be obtained without inviting an increase in cost even when a firing treatment is conducted at low temperatures.

6 Claims, 3 Drawing Sheets

U.S. PATENT DOCUMENTS

| | | | |
|---|---|---|---|
| 7,605,522 B2 * | 10/2009 | Yamamoto et al. | 310/358 |
| 7,667,377 B2 * | 2/2010 | Yamamoto et al. | 310/358 |
| 2002/0098333 A1 * | 7/2002 | Feltz et al. | 428/210 |
| 2007/0125977 A1 * | 6/2007 | Kawamoto et al. | 252/62.9 PZ |
| 2007/0228894 A1 * | 10/2007 | Ishikura et al. | 310/363 |
| 2008/0095927 A1 * | 4/2008 | Nanataki et al. | 427/100 |
| 2009/0015109 A1 * | 1/2009 | Schuh | 310/364 |
| 2010/0102138 A1 * | 4/2010 | Denzler et al. | 239/1 |
| 2010/0107390 A1 * | 5/2010 | Yamamoto et al. | 29/25.35 |

FOREIGN PATENT DOCUMENTS

| | | |
|---|---|---|
| JP | 2002299710 A * | 10/2002 |
| JP | 2004-111895 | 4/2004 |
| JP | 2005-285883 | 10/2005 |
| WO | WO 2005/071769 | 8/2005 |

* cited by examiner

MONOLITHIC PIEZOELECTRIC ELEMENT

CROSS REFERENCE TO RELATED APPLICATIONS

The present application is a continuation of International Application No. PCT/JP2007/070991, filed Oct. 29, 2007, which claims priority to Japanese Patent Application No. JP2006-329141, filed Dec. 6, 2006, the entire contents of each of these applications being incorporated herein by reference in their entirety.

FIELD OF THE INVENTION

The present invention relates to a monolithic piezoelectric element, e.g., a piezoelectric actuator, a piezoelectric resonator, or a piezoelectric filter, and a method for manufacturing the same.

BACKGROUND OF THE INVENTION

PZT piezoelectric ceramic containing $Pb(Ti,Zr)O_3$ (hereafter referred to as "PZT") as a primary component is typical piezoelectric ceramic used for a monolithic piezoelectric element, e.g., a piezoelectric actuator, a piezoelectric resonator, or a piezoelectric filter, in the public domain.

Furthermore, as for this type of monolithic piezoelectric element, those produced by laminating internal electrode layers formed from a Ag—Pd alloy and piezoelectric ceramic layers formed from PZT piezoelectric ceramic alternately and conducting co-firing have been used frequently. However, since Pd is expensive, research and development of monolithic piezoelectric elements in which inexpensive Cu is used as a material for internal electrodes has been conducted intensively.

For example, Patent Document 1 describes a monolithic piezoelectric element in which internal electrode layers contain Cu as a primary component and PZT piezoelectric ceramic is used.

This Patent Document 1 discloses a monolithic piezoelectric element provided with electrodes containing Cu as a primary component and piezoelectric ceramic, wherein the piezoelectric ceramic contains a perovskite type oxide, which is represented by a general formula $ABO_3$ and in which the A site includes Pb and the B site includes Zr and Ti, as primary components, the B site includes an acceptor element composed of a divalent metal element and a donor element composed of a pentavalent metal element, and $0.42<a/b<0.5$ is satisfied where the total number of moles of acceptor element is represented by a and the total number of moles of donor element is represented by b.

In the case where the electrodes containing Cu as a primary component and the piezoelectric ceramic are co-fired, Cu in the electrode is diffused into the piezoelectric ceramic, and Cu in the state of a Cu ion functions as a divalent acceptor element. Therefore, regarding the monolithic piezoelectric element in Patent Document 1, the B site of the piezoelectric ceramic composition is specified to include donors excessively in such a way that $0.42<a/b<0.5$ is satisfied where the total number of moles of acceptor element is represented by a and the total number of moles of donor element is represented by b and, thereby, it is intended to suppress reduction in piezoelectric constant by canceling reduction in the average valence of B site due to diffusion of Cu.

Patent Document 1: International Patent Publication WO 2005/071769

However, in the case where the internal electrode material containing Cu as a primary component is used as in Patent Document 1, it is necessary that co-firing is conducted in a reducing atmosphere in order to suppress oxidation of Cu. Consequently, there is a problem in that a sufficiently high piezoelectric constant $d_{33}$ cannot be obtained.

Furthermore, it is known that if the B site is allowed to include donors excessively as in Patent Document 1, the sinterability deteriorates. Therefore, in the case where the B site is allowed to include donors excessively, there is a need to conduct firing at relatively high temperatures. For example, regarding the monolithic piezoelectric element in Patent Document 1, firing is conducted while the firing temperature is set at 1,000° C. (refer to the paragraph No. [0048] in Patent Document 1).

SUMMARY OF THE INVENTION

On the other hand, in order to obtain a high piezoelectric constant, it is desirable that diffusion of the internal electrode material into the piezoelectric ceramic layer is minimized. For that purpose, there is a need to conduct firing at still lower temperatures. Furthermore, if the firing temperature is lowered, energy required for firing is reduced and, therefore, a fuel and an electric power are saved and the production cost is reduced.

The present invention has been made in consideration of the above-described circumstances. It is an object of the present invention to provide a monolithic piezoelectric element and a method for manufacturing the same, wherein a desired large piezoelectric constant can be obtained without inviting an increase in cost even when firing is conducted at low temperatures.

Although Ag has a high electrical conductivity and is relatively inexpensive, the melting point is a low 960° C. and the reliability is poor if Ag is used alone. Consequently, as is described in the item "Background Art", a Ag—Pd alloy, in which an expensive but high-melting point Pd (melting point: about 1,550° C.) has been blended to Ag, has been used widely up to now.

However, it is believed that if the blend ratio of Pd in the Ag—Pd alloy is small, economic burdens are reduced and, in addition, it is possible to realize a high piezoelectric constant monolithic piezoelectric element taking advantage of Ag. In this regard, firing at lower temperatures is indispensable for decreasing the blend ratio of Pd and increasing the blend ratio of Ag.

On the other hand, Ag is diffused into the piezoelectric ceramic layer through co-firing and functions as an acceptor so as to disturb the charge balance and reduce the average valence of the piezoelectric ceramic composition. Therefore, it is necessary that the charge compensation is conducted without inviting an increase in firing temperature in order to obtain a high piezoelectric constant.

Then, the present inventors conducted intensive research by using a Ag—Pd alloy as an internal electrode material. As a result, it was found that a part of Ag was able to be almost uniformly diffused into a piezoelectric ceramic layer by allowing an internal electrode pattern serving as an internal electrode layer to contain a pentavalent or hexavalent metal element functioning as a donor in advance and co-firing a laminate of the internal electrode patterns and piezoelectric ceramic green sheets in an oxygen atmosphere and, thereby, a reduction in average valence due to diffusion of Ag was able to be charge-compensated in a region in which Ag content is 85 percent by weight or more (Pd content is 15 percent by weight or less). In addition, it was also found that the above-described metal element was able to be diffused, while taking on the form of a metal oxide, in the piezoelectric ceramic layer in such a way that the concentration was reduced with decreasing proximity to the internal electrode layer and, thereby, presence of excess metal oxide in the piezoelectric ceramic layer was able to be minimized.

The present invention was made on the basis of the above-described findings. A monolithic piezoelectric element according to the present invention is characterized by including an element assembly in which internal electrode layers and piezoelectric ceramic layers are laminated alternately, wherein the above-described internal electrode layer contains a Ag—Pd alloy, which has a Ag content of 85 percent by weight or more, as a primary component and, in addition, contains a metal element having a valence of at least one of pentavalence or hexavalence, the above-described piezoelectric ceramic layer contains a composite oxide represented by $Pb(Ti,Zr)O_3$ as a primary component, a part of Ag contained in the above-described internal electrode layer is almost uniformly diffused and, in addition, the above-described metal element is diffused, while taking on the form of a metal oxide, in such a way that the concentration is reduced with decreasing proximity to the above-described internal electrode layer.

Furthermore, the monolithic piezoelectric element according to the present invention is characterized in that the above-described metal element is at least one type selected from the group consisting of Nb, Sb, Ta, and W.

Moreover, the monolithic piezoelectric element according to the present invention is characterized in that the average valence $\alpha$ of the Pb site constituting $Pb(Ti,Zr)O_3$ described above and the average valence $\beta$ of the (Ti,Zr) site satisfy $1.95 \leq \alpha \leq 2.05$ and $3.95 \leq \beta \leq 4.05$, respectively.

In addition, a method for manufacturing a monolithic piezoelectric element according to the present invention is characterized by including the steps of preparing a laminate in which internal electrode patterns and piezoelectric ceramic green sheets are laminated alternately in a lamination step and preparing an element assembly in which the internal electrode layers and the piezoelectric ceramic layers are laminated alternately by firing the above-described laminate in a firing step, wherein the above-described piezoelectric ceramic green sheet contains a composite oxide represented by $Pb(Ti,Zr)O_3$ as a primary component, the above-described internal electrode pattern contains an electrically conductive powder including a Ag—Pd alloy, which has a Ag content of 85 percent by weight or more, as a primary component and a metal element having a valence of at least one of pentavalence or hexavalence, and in the above-described firing step, a part of Ag described above is almost uniformly diffused into the above-described piezoelectric ceramic layer by conducting firing in an oxygen atmosphere and, in addition, the above-described metal element is diffused, while taking on the form of a metal oxide, into the above-described piezoelectric ceramic layer in such a way that the concentration is reduced with decreasing proximity to the above-described internal electrode layer.

Furthermore, the method for manufacturing a monolithic piezoelectric element, according to the present invention, is characterized in that the above-described metal element is at least one type selected from the group consisting of Nb, Sb, Ta, and W.

Moreover, the method for manufacturing a monolithic piezoelectric element, according to the present invention, is characterized in that the content of the above-described metal element in terms of metal oxide in the above-described internal electrode pattern is 35.0 percent by weight or less (excluding 0 percent by weight) relative to a total content of the above-described electrically conductive powder and the above-described metal oxide.

Incidentally, in the present invention, the phrase "is almost uniformly diffused" refers to that the state of being uniformly or substantially uniformly diffused is recognized and no concentration gradient results from diffusion.

In the monolithic piezoelectric element according to the present invention, the internal electrode layer contains the Ag—Pd alloy, which has a Ag content of 85 percent by weight or more, as a primary component and a metal element having a valence of at least one of pentavalence or hexavalence, the above-described piezoelectric ceramic layer contains the composite oxide represented by $Pb(Ti,Zr)O_3$ as a primary component, a part of Ag contained in the above-described internal electrode layer is almost uniformly diffused and, furthermore, the above-described metal element (Nb, Sb, Ta, W, or the like) is diffused, while taking on the form of a metal oxide, in such a way that the concentration is reduced with decreasing proximity to the above-described internal electrode layer. Consequently, a reduction in average valence due to diffusion of Ag can be charge-compensated by the above-described metal element effectively. Therefore, a sufficiently high desired piezoelectric constant can be obtained without conducting charge compensation by allowing the B site of the piezoelectric ceramic composition to include donors excessively. Moreover, since there is no need to allow the piezoelectric ceramic composition to include donors excessively, the sinterability can be improved, and firing can be conducted at still lower temperatures. In addition, presence of excess metal oxide in the piezoelectric ceramic layer can be minimized and, thereby, deterioration of sinterability can be further suppressed, so that the piezoelectric constant can be improved.

Furthermore, since the Ag content in the Ag—Pd alloy is 85 percent by weight or more, the Pd content becomes 15% or less, so that an increase in material cost can be minimized.

Furthermore, since the average valence $\alpha$ of the Pb site constituting $Pb(Ti,Zr)O_3$ described above and the average valence $\beta$ of the (Ti,Zr) site satisfy $1.95 \leq \alpha \leq 2.05$ and $3.95 \leq \beta \leq 4.05$, respectively, a desired monolithic piezoelectric element which does not cause deterioration of sinterability nor piezoelectric characteristics can be obtained.

Furthermore, in the method for manufacturing a monolithic piezoelectric element according to the present invention, the above-described piezoelectric ceramic green sheet contains the composite oxide represented by $Pb(Ti,Zr)O_3$ as a primary component, the above-described internal electrode pattern contains the electrically conductive powder including a Ag—Pd alloy, which has a Ag content of 85 percent by weight or more, as a primary component and the metal element (Nb, Sb, Ta, W, or the like) having a valence of at least one of pentavalence or hexavalence, and in the above-described firing step, Ag described above is diffused into the above-described piezoelectric ceramic layer by conducting firing in an oxygen atmosphere and, furthermore, the above-described metal element is diffused, while taking on the form of a metal oxide, e.g., $Nb_2O_5$, $Sb_2O_5$, $Ta_2O_5$, or $WO_3$, into the above-described piezoelectric ceramic layer in such a way that the concentration is reduced with decreasing proximity to the above-described internal electrode layer. Therefore, a reduction in average valence due to diffusion of Ag can be charge-compensated by the above-described metal element effectively, and a monolithic piezoelectric element having a sufficient piezoelectric constant can be produced even through low-temperature firing. In addition, since firing is conducted in the oxygen atmosphere, Ag is almost uniformly diffused into the piezoelectric ceramic layer and, thereby, a monolithic piezoelectric element having a further improved piezoelectric constant can be produced. Moreover, a concentration gradient of the above-described metal oxide is formed in the piezoelectric ceramic layer, so that presence of excess metal oxide in the piezoelectric ceramic layer is minimized.

Furthermore, the content of the above-described metal element in terms of metal oxide in the above-described internal electrode pattern is 35.0 percent by weight or less (excluding 0 percent by weight) relative to a total content of the above-described electrically conductive powder and the above-described metal oxide. Therefore, the electrical connectivity between the internal electrode and the external electrode does not deteriorate, so that a high-quality monolithic piezoelectric element exhibiting excellent reliability can be obtained.

As described above, according to the monolithic piezoelectric element and the method for manufacturing the same of the present invention, a monolithic piezoelectric element having a desired sufficiently high piezoelectric constant can be produced even through low-temperature firing. Specifically, a monolithic piezoelectric element having a high piezoelectric constant $d_{33}$ of 700 pm/V or more can be obtained at a low firing temperature of 925° C. at a low cost.

REFERENCE NUMERALS 10 element assembly
11 piezoelectric ceramic layer
21, 22 internal electrode layer

DETAILED DESCRIPTION OF THE INVENTION

The embodiments according to the present invention will be described below in detail with reference to the drawings.

Figure 1:
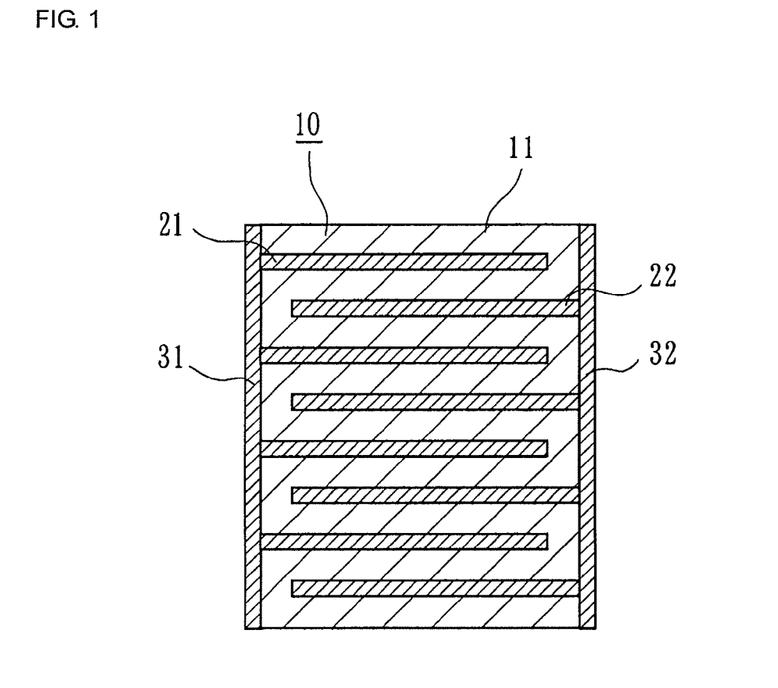
FIG. 1 is a sectional view showing a monolithic piezoelectric element according to the present invention.

FIG. 1 is a sectional view showing an embodiment of a monolithic piezoelectric element according to the present invention.

This monolithic piezoelectric element 1 includes an element assembly 10 in which piezoelectric ceramic layers 11 and internal electrode layers 21 and 22 are laminated alternately and external electrodes 31 and 32 disposed on the surfaces of the element assembly 10. The internal electrode layers 21 connected to one external electrode 31 and the internal electrode layers 22 connected to the other external electrode 32 are disposed alternately. Then, this monolithic piezoelectric element has a configuration in which an electric field is generated between the internal electrode layers 21 and 22 by application of a voltage between the external electrodes 31 and 32 and, thereby, the piezoelectric ceramic layers 11 expand and contract.

The internal electrode layers 21 and 22 contains an electrically conductive powder including a Ag—Pd alloy, which has a Ag content of 85 percent by weight or more, as a primary component and a metal oxide containing a metal element having a valence of at least one of pentavalence or hexavalence. Specifically, Nb, Sb, Ta, and the like are used as the pentavalent metal element, and W (tungsten) and the like are used as the hexavalent metal oxide. Therefore, these metal elements are contained, while taking on the form of a metal oxide, e.g., $Nb_2O_5$, $Sb_2O_5$, $Ta_2O_5$, or $WO_3$, in the internal electrode layers 21 and 22.

The piezoelectric ceramic layer 11 contains a PZT composite oxide, which has a perovskite type structure (general formula: $ABO_3$), as a primary component. Besides the case where the layer is formed from $PZT(Pb(Ti,Zr)O_3)$ alone, a form, in which a part of the B site is substituted with Ni, Nb, Zn, or the like by allowing another perovskite type composite oxide, e.g., $Pb(Ni,Nb)O_3$ or $Pb(Zn,Nb)O_3$, to make a solid solution with PZT, may be employed.

Furthermore, the above-described PZT composite oxide may has a composition in which a part of the B site ((Ti,Zr) site) is substituted with combinations of various positive ions, for example, a combination of univalent positive ion and pentavalent positive ion, a combination of divalent positive ion and pentavalent positive ion, a combination of trivalent positive ion and pentavalent positive ion, and a combination of trivalent positive ion and hexavalent positive ion. Here, as for the univalent positive ion, Na and K can be used. As for the divalent positive ion, Ni, Zn, Co, Mg, Mn, Fe, Cr, and Cu can be used. As for the trivalent positive ion, Fe, In, Sc, and Yb can be used. As for the pentavalent positive ion, Nb, Sb, Ta, and V can be used. As for the hexavalent positive ion, W and the like can be used.

The average valence of the B site ((Ti,Zr) site) is specified to be tetravalence or in the vicinity thereof and, specifically, 3.95 or more, and 4.05 or less is preferable. That is, even when firing is conducted in an oxygen atmosphere, Ag in the internal electrode layers 21 and 22 is in a metal state, but a part of Ag diffuses from the internal electrode layers 21 and 22 to the ceramic layers 11. Then, Ag diffused into the ceramic layers 11 is oxidized to become $Ag_2O$. However, if the average valence of the B site becomes less than 3.95, piezoelectric characteristics may deteriorate because of excessive diffusion of $Ag_2O$ from the internal electrode layers 21 and 22 into the piezoelectric ceramic layers 11. On the other hand, if the above-described average valence exceeds 4.05, the sinterability may deteriorate and firing at low temperatures may become difficult.

If necessary, a part of Pb constituting the A site (Pb site) of the PZT composite oxide may be substituted with a divalent positive ion, e.g., Ba, Sr, or Ca, or a trivalent positive ion, e.g., La, Y, Bi, or Nd. In this case, it is preferable that the substitution ratio with these elements is specified to be 5 percent by mole or less. This is because if the substitution ratio exceeds 5 percent by mole, deterioration of the sinterability may be invited.

The average valence of the A site (Pb site) is specified to be divalence or in the vicinity thereof and, specifically, 1.95 or more, and 2.05 or less is preferable. This is because if the average valence of the A site is less than 1.95 or exceeds 2.05, the sinterability may deteriorate and firing at low temperatures may become difficult.

Furthermore, Ag contained in the internal electrode layers 21 and 22 is almost uniformly diffused into the piezoelectric ceramic layers 11 without forming a concentration gradient. Consequently, a reduction in the average valence due to diffusion of Ag is charge-compensated without allowing the piezoelectric ceramic composition to include donors excessively.

That is, when a laminate in which internal electrode patterns containing Ag as a primary component and piezoelectric ceramic green sheets containing $Pb(Ti,Zr)O_3$ as a primary component are laminated is fired in an oxygen atmosphere, a part of Ag is diffused into the piezoelectric ceramic layers 11 and is oxidized to become $Ag_2O$. At that time, Ag serving as a univalent positive ion makes a solid solution with Pb site and functions as an acceptor. Therefore, if things continue as they are, the charge balance of the piezoelectric ceramic layer 11 is disturbed, and deterioration of the piezoelectric constant $d_{33}$ is invited.

As for the means for avoiding the deterioration of piezoelectric constant $d_{33}$, it is conceived that the piezoelectric ceramic composition is allowed to include donors excessively in advance, as described in Patent Document 1.

However, if the piezoelectric ceramic composition is allowed to include donors excessively, an increase in firing temperature is invited, the need for raising the melting point of a Ag—Pd alloy by increasing the amount of blend of Pd arises, so that an increase in material cost is invited undesirably.

On the other hand, in the present embodiment, a metal oxide (for example, $Nb_2O_5$, $Sb_2O_5$, $Ta_2O_5$, or $WO_3$) containing a pentavalent or hexavalent metal element functioning as a donor is included in the internal electrode patterns in advance, firing is conducted in the oxygen atmosphere and, thereby, a part of Ag is almost uniformly diffused into the piezoelectric ceramic together with the above-described metal oxide. Consequently, a reduction in the average valence due to diffusion of Ag functioning as an acceptor is charge-compensated, and a reduction in the piezoelectric constant $d_{33}$ can be suppressed without allowing the piezoelectric ceramic composition to include donors excessively.

The mechanism thereof is estimated as described below.

Since Ag is difficult to oxidize in contrast to Cu, firing can be conducted in an oxygen atmosphere. According to the results of the experiment conducted by the present inventors, it was found that when firing was conducted in the oxygen atmosphere, a part of Ag in the internal electrode layers 21 and 22 was converted to $Ag_2O$ and was almost uniformly diffused into the piezoelectric ceramic layers 11. On the other hand, it was found that the metal oxide was diffused into the piezoelectric ceramic layers 11 while having a certain concentration gradient in such a way that the concentration of the metal oxide was high in the vicinity of the internal electrode layers 21 and 22 and the concentration of the metal oxide was reduced with decreasing proximity to the internal electrode layers 21 and 22.

That is, in the piezoelectric ceramic layers 11, Ag is almost uniformly diffused, whereas the metal oxide is diffused while having a certain concentration gradient and, in addition, a reduction of the piezoelectric constant is suppressed even when low-temperature firing is conducted. Consequently, it is believed that Ag in the form of being bonded to a part of the metal oxide is diffused into the piezoelectric ceramic layers 11 and, thereby, charge compensation is conducted effectively. On the other hand, it is believed that the residual metal oxide, which is diffused into the piezoelectric ceramic layers 11 without bonding to Ag, is diffused into the piezoelectric ceramic layers 11 alone and, thereby, the concentration gradient of the metal oxide is formed.

Moreover, in the piezoelectric ceramic layers 11, as described above, the metal oxide is diffused while having a certain concentration gradient in such a way that the concentration of the metal oxide is high in the vicinity of the internal electrode layers 21 and 22 and the concentration of the metal oxide is reduced with decreasing proximity to the internal electrode layers 21 and 22. Therefore, as compared with the case where the piezoelectric ceramic composition is allowed to include donors excessively, presence of excess metal oxide in the piezoelectric ceramic layers 11 can be minimized. From this point as well, deterioration of sinterability can be suppressed and firing can be conducted at low temperatures.

In addition, regarding the above-described internal electrode layers 21 and 22, the Ag content in the Ag—Pd alloy is 85 percent by weight or more. Therefore, the content of high-price Pd can be reduced to 15 percent by weight or less and an increase in cost can be minimized.

In this regard, if the Ag content in the Ag—Pd alloy becomes less than 85 percent by weight (Pd content exceeds 15 percent by weight), the Ag content in the internal electrode pattern is reduced. Therefore, the amount of diffusion of Ag functioning as an acceptor decreases. As a result, a reduction of the piezoelectric constant $d_{33}$ due to diffusion of Ag is suppressed. Consequently, there is no need to allow the internal electrode pattern to contain the above-described metal oxide.

However, in this case, since the blend ratio of Pd in the Ag—Pd alloy increases, unfavorably, the raw material cost increases and mass productivity becomes poor.

On the other hand, in the present embodiment, the Ag—Pd alloy having a Ag content of 85 percent by weight or more is used. Therefore, the cost does not increase even when the firing is conducted at low temperatures, and a monolithic piezoelectric element having a desired high piezoelectric constant can be realized.

In this manner, according to the present embodiment, a reduction in the average valence due to diffusion of Ag into the piezoelectric ceramic layers 11 can be charge-compensated by metal elements, e.g., Nb, Sb, Ta, and W, which are diffused into the piezoelectric ceramic layers 11. Therefore, there is no need to allow the piezoelectric ceramic composition to include donors excessively so as to conduct charge compensation, and a monolithic piezoelectric element having a sufficiently high piezoelectric constant can be obtained relatively inexpensively through low-temperature firing. Specifically, a monolithic piezoelectric element having a high piezoelectric constant $d_{33}$ of 700 pm/V or more can be obtained at a firing temperature of 925° C. at a low cost.

Furthermore, the external electrodes 31 and 32 are composed of Cu, a Ag—Pd alloy, or the like and are formed on a surface of the element assembly 10 by conducting a baking treatment or the like.

A method for manufacturing this monolithic piezoelectric element will be described below.

First, ceramic raw materials, e.g., $Pb_3O_4$, $TiO_2$, and $ZrO_2$, and if necessary, NiO, ZnO, $Nb_2O_5$, and the like, are prepared. They are mixed and pulverized in such a way as to have a predetermined composition. The resulting mixed raw material is calcined so as to obtain a calcined powder. In this regard, it is preferable that the above-described predetermined composition is a composition in the vicinity of MPB (Morphotropic Phase Boundary) capable of obtaining a high piezoelectric constant.

Next, the resulting calcined powder is kneaded with a binder and a plasticizer, and piezoelectric ceramic green sheets are produced by a doctor blade method.

Furthermore, an electrically conductive powder containing a Ag—Pd alloy powder (Ag content: 85 percent by weight or more) as a primary component and an electrically conductive paste for an internal electrode, the paste containing a metal oxide, for example, at least one type of $Nb_2O_5$, $Sb_2O_5$, $Ta_2O_5$, and $WO_3$, having a pentavalent or hexavalent metal element, are produced.

Here, it is preferable that the content of the above-described metal oxide in the electrically conductive paste for an internal electrode is 35 percent by weight or less relative to a total solid content (electrically conductive powder and metal oxide). More preferably, the content is adjusted to be 5 to 25 percent by weight, and further preferably 10 to 25 percent by weight.

That is, the above-described metal oxide is contained in the electrically conductive paste for an internal electrode in such a way as to become 35 percent by weight or less relative to a total solid content. Consequently, charge compensation of Ag which is diffused to the piezoelectric ceramic layers 11 side can be conducted effectively, and a high piezoelectric constant of 700 pm/V or more can be obtained reliably even when the firing temperature is 925° C.

In particular, in the case where at least 5 percent by weight of metal oxide is contained relative to a total solid content, a high piezoelectric constant $d_{33}$ of 700 pm/V or more can be obtained reliably even when the firing temperature is 925° C. Moreover, in the case where 10 percent by weight or more of metal oxide is contained relative to a total solid content, the piezoelectric characteristics can be further improved.

However, if the content of the above-described metal oxide exceeds 35 percent by weight, the Ag content in the internal electrode layers 21 and 22 after firing is reduced, and electrical connectivity to the external electrodes 31 and 32 may deteriorate, so that a defective product may result.

Furthermore, in the case where the metal oxide exceeds 25 percent by weight relative to the total solid content, the piezoelectric constant $d_{33}$ is almost constant or tends to decrease, so that an unnecessary increase of the metal oxide has no advantage.

Therefore, as described above, it is preferable that the content of the metal oxide in the electrically conductive paste is specified to be 35 percent by weight or less relative to a total solid content (electrically conductive powder and metal oxide). More preferably, the content is adjusted to be 5 to 25 percent by weight, and further preferably 10 to 25 percent by weight.

Next, internal electrode patterns are formed by printing the above-described electrically conductive paste on the piezoelectric ceramic green sheets. Thereafter, the piezoelectric ceramic green sheets provided with the internal electrode patterns and plain piezoelectric ceramic green sheets provided with no internal electrode pattern are laminated in a predetermined order so as to produce a laminate.

Subsequently, the resulting laminate is fired at a firing temperature of about 925° C. to 975° C. for about 5 to 10 hours in an oxygen atmosphere so as to produce an element assembly 10.

Regarding this firing step, a part of Ag contained in the internal electrode patterns is almost uniformly diffused into the piezoelectric ceramic layers 11. On the other hand, at least a part of the metal oxide is diffused alone into the piezoelectric ceramic layers 11 in such a way that the concentration is reduced with decreasing proximity to the internal electrode layers 21 and 22.

Next, external electrodes are formed by baking an electrically conductive paste containing Cu or a Ag—Pd alloy as a primary component on the surface of the resulting element assembly. Polarization is conducted by applying a predetermined voltage in oil and, thereby, a monolithic piezoelectric element is produced.

As described above, in the present embodiment, firing is conducted in the oxygen atmosphere, and a part of Ag contained in the internal electrode layers 21 and 22 is almost uniformly diffused into the piezoelectric ceramic layers 11 together with the metal oxide. Consequently, a reduction in average valence due to diffusion of Ag into the piezoelectric ceramic layers 11 can be charge-compensated by the above-described metal element effectively. Therefore, there is no need to allow the piezoelectric ceramic composition to include donors excessively in order to conduct charge compensation, and a monolithic piezoelectric element having a high piezoelectric constant $d_{33}$ can be produced through low-temperature firing.

In addition, at least a part of the metal oxide which is diffused from the internal electrode layers 21 and 22 is diffused alone into the piezoelectric ceramic layers 11 in such a way that the concentration is reduced with decreasing proximity to the internal electrode layers 21 and 22. Consequently, it can be minimized that excess metal oxide is contained in the piezoelectric ceramic layers 11. The firing temperature can also be lowered thereby.

Incidentally, the present invention is not limited to the above-described embodiment. In the above-described embodiment, the metal oxide containing the pentavalent or hexavalent metal element is contained in the internal electrode patterns. However, it is not necessary that the form of metal oxide is contained in the internal electrode patterns insofar as the distribution in the piezoelectric ceramic layers 11 is in the form of metal oxide. That is, in the internal electrode patterns, for example, a simple substance of metal may be contained, or a compound, e.g., a carbonate, a hydroxide, or an organic compound, may be contained. In this regard, in the case where a pentavalent or hexavalent metal element is contained in the electrically conductive paste for internal electrode layer while being in the form other than a metal oxide, it is preferable that addition is conducted in such a way that the content becomes less than 35.0 percent by weight in terms of metal oxide relative to a total solid content.

Furthermore, in the present invention, a sufficient piezoelectric constant can be obtained through low-temperature firing without allowing the B site of the piezoelectric ceramic composition to include donors excessively. However, it is not completely excluded that the B site composition includes donors excessively, but donors may be included excessively within the bounds of not affecting the characteristics nor inviting deterioration of sinterability.

Moreover, in the piezoelectric ceramic layer, the form of presence of the above-described metal oxide which is diffused from the internal electrode layer side to the piezoelectric ceramic layer may be any case of presence in crystal grain boundaries, crystal triple points, crystal grains through making solid solutions with composite oxides having a perovskite structure, or the like.

The examples according to the present invention will be specifically described below.

EXAMPLE 1

First, each of powders of $Pb_3O_4$, $TiO_2$, $ZrO_2$, NiO, ZnO, and $Nb_2O_5$ was prepared as a ceramic raw material, and they were weighed in such a way that the composition was represented by a compositional formula (1) described below.

$$Pb\{(Ni_{1/3}Nb_{2/3})_{0.1}(Zn_{1/3}Nb_{2/3})_{0.1}Ti_{0.42}Zr_{0.38}\}O_3 \qquad (1)$$

Next, the resulting weighed powders were mixed and wet-pulverized for 16 hours. Thereafter, calcination was conducted at 880° C. and, thereby, a calcined powder was obtained.

Then, the resulting calcined powder was kneaded with a binder and a plasticizer, and piezoelectric ceramic green sheets having a thickness of 60 μm were produced by a doctor blade method.

Subsequently, a Ag—Pd alloy powder blended to have the Ag content of 80 to 95 percent by weight was prepared as an electrically conductive powder and, furthermore, $Nb_2O_5$ was prepared as a metal oxide containing a pentavalent metal element.

Then, these Ag—Pd alloy powder and $Nb_2O_5$ were weighed in such a way that the $Nb_2O_5$ content became 0 to 40 percent by weight relative to a total solid content (Ag—Pd alloy powder and $Nb_2O_5$). A binder and the like were added to the resulting weighed material, and kneading was conducted in an organic vehicle, so that an electrically conductive paste for an internal electrode was produced.

Next, internal electrode patterns were formed by printing the above-described electrically conductive paste on the piezoelectric ceramic green sheets. After the piezoelectric ceramic green sheets provided with the internal electrode patterns and plain piezoelectric ceramic green sheets provided with no internal electrode pattern were laminated alternately, contact bonding was conducted with a press machine, so that a laminate was produced, in which the internal electrode patterns were 80 layers and the distance between the internal electrode patterns was 120 μm.

Next, the resulting laminate was subjected to a binder removal treatment and was fired at 5 hours in an oxygen atmosphere, so that a ceramic sintered member was produced. In this regard, the firing temperature was set at 925° C., 950° C., or 975° C. and, thereby, three types of ceramic sintered members having different firing temperatures were obtained on a laminate basis.

Subsequently, the resulting ceramic sintered member was cut into 7 mm long and 7 mm wide so as to produce an element assembly. An electrically conductive paste for external electrodes, the paste containing Cu as a primary component, was applied to surfaces of the resulting element assembly, followed baking, so that external electrodes were formed thereby.

Then, polarization was conducted at a temperature of 80° C. in silicone oil at electric field strength of 3 kV/mm. In this manner, regarding each of Sample Nos. 1 to 32, three types of monolithic piezoelectric elements were produced. In this regard, the dimension of the monolithic piezoelectric element was 6 mm long, 6 mm wide, and 8 mm high.

Thereafter, 2.0 kV/mm of electric field strength was applied to each of the resulting samples by a triangular wave with a frequency of 0.1 kHz. The distortion factor in a thickness direction at that time was measured with an inductive probe and a differential transformer transducer, and the piezoelectric constant $d_{33}$ was calculated by dividing the resulting distortion factor by the electric field.

Table 1 shows the $Nb_2O_5$ content relative to a total solid content in the internal electrode pattern of each sample and the piezoelectric constant $d_{33}$ at each firing temperature.

TABLE 1

| Sample No. | Ag/Pd | $Nb_2O_5$ content (percent by weight) | Piezoelectric constant $d_{33}$ (pm/V) Firing temperature 925° C. | Firing temperature 950° C. | Firing temperature 975° C. |
|---|---|---|---|---|---|
| 1* | 95/5 | 0 | 638 | 632 | 661 |
| 2 | | 5 | 731 | 728 | 772 |
| 3 | | 10 | 733 | 748 | 779 |
| 4 | | 15 | 740 | 753 | 787 |
| 5 | | 20 | 735 | 751 | 791 |
| 6 | | 25 | 725 | 740 | 754 |
| 7 | | 30 | 729 | 736 | 744 |
| 8 | | 35 | 726 | 729 | 742 |
| 9* | 90/10 | 0 | 678 | 680 | 691 |
| 10 | | 5 | 730 | 729 | 751 |
| 11 | | 10 | 733 | 756 | 773 |
| 12 | | 15 | 741 | 753 | 783 |
| 13 | | 20 | 743 | 748 | 765 |
| 14 | | 25 | 734 | 749 | 755 |
| 15 | | 30 | 721 | 731 | 749 |
| 16 | | 35 | 716 | 726 | 731 |
| 17* | 85/15 | 0 | 679 | 689 | 691 |
| 18 | | 5 | 721 | 750 | 745 |
| 19 | | 10 | 744 | 770 | 784 |
| 20 | | 15 | 743 | 765 | 795 |
| 21 | | 20 | 731 | 750 | 781 |
| 22 | | 25 | 735 | 741 | 781 |
| 23 | | 30 | 725 | 748 | 725 |
| 24 | | 35 | 722 | 735 | 716 |
| 25* | 80/20 | 0 | 753 | 765 | 802 |
| 26* | | 5 | 745 | 768 | 807 |
| 27* | | 10 | 758 | 771 | 801 |
| 28* | | 15 | 743 | 736 | 811 |
| 29* | | 20 | 751 | 748 | 784 |
| 30* | | 25 | 721 | 755 | 774 |
| 31* | | 30 | 720 | 751 | 751 |
| 32* | | 35 | 711 | 724 | 743 |

Asterisked sample numbers indicate samples which are out of the present invention In Sample Nos. 1 to 8, the blend ratio, Ag/Pd, of Ag to Pd was specified to be 95/5.

Regarding Sample No. 1, since $Nb_2O_5$ was not contained in the internal electrode pattern, $Nb_2O_5$ was not diffused from the internal electrode layer to the piezoelectric ceramic layer. Consequently, in the case where the firing temperature was 925° C., the piezoelectric constant $d_{33}$ was a low 638 pm/V, and even when the firing temperature was raised to 975° C., the piezoelectric constant $d_{33}$ was a low 661 pm/V.

On the other hand, regarding Sample Nos. 2 to 8, since 5 to 35 percent by weight of $Nb_2O_5$ was contained in the internal electrode pattern, $Nb_2O_5$ in the internal electrode pattern was diffused to the piezoelectric ceramic layer side. As a result, in the case where the firing temperature was 975° C., the piezoelectric constants $d_{33}$ were 742 to 791 pm/V, and even when the firing temperature was specified to be 925° C., the piezoelectric constants $d_{33}$ were 725 to 740 pm/V. That is, every piezoelectric constant $d_{33}$ was 700 pm/V or more, and it was made clear that a high piezoelectric constant $d_{33}$ was able to be obtained through low-temperature firing as compared with that in Sample No. 1.

Figure 2:
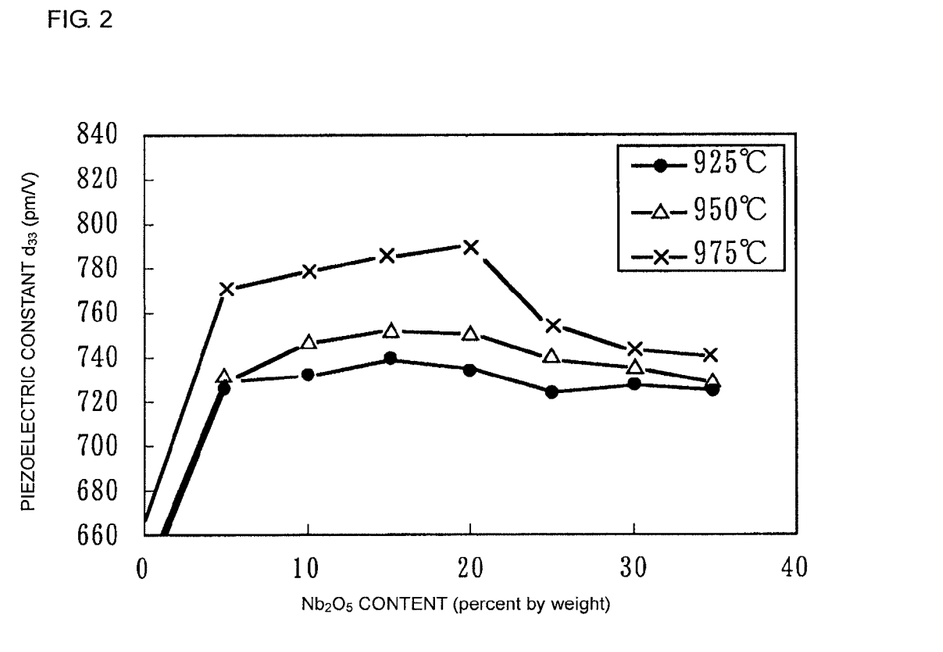
FIG. 2 is a diagram showing the relationship between the piezoelectric constant $d_{33}$ and the $Nb_2O_5$ content relative to a total solid content in an electrically conductive paste in the case where the blend ratio Ag/Pd is specified to be 95/5.

FIG. 2 is a diagram showing the relationship between the $Nb_2O_5$ content and the piezoelectric constant $d_{33}$ regarding Sample Nos. 1 to 8. The horizontal axis indicates the $Nb_2O_5$ content (percent by weight) relative to a total solid content, and the vertical axis indicates the piezoelectric constant $d_{33}$ (pm/V). In the drawing, symbol ● indicates that the firing temperature was 925° C., symbol Δ indicates that the firing temperature was 950° C., and symbol x indicates that the firing temperature was 975° C.

As is clear from FIG. 2, the piezoelectric constant $d_{33}$ increases sharply by allowing the internal electrode pattern to contain merely 5 percent by weight of $Nb_2O_5$ relative to a total solid content. Furthermore, it is clear that when the $Nb_2O_5$ content exceeds 25 percent by weight relative to a total solid content, the piezoelectric constant $d_{33}$ becomes almost constant or tends to decrease.

In Sample Nos. 9 to 16, the blend ratio, Ag/Pd, of Ag to Pd was specified to be 90/10.

Regarding Sample No. 9, since $Nb_2O_5$ was not contained in the internal electrode pattern, as in Sample No. 1, in the case where the firing temperature was 925° C., the piezoelectric constant $d_{33}$ was a low 678 pm/V, and even when the firing temperature was raised to 975° C., the piezoelectric constant $d_{33}$ was a low 691 pm/V.

On the other hand, regarding Sample Nos. 10 to 16, since 5 to 35 percent by weight of $Nb_2O_5$ was contained in the internal electrode pattern, $Nb_2O_5$ in the internal electrode pattern was diffused to the piezoelectric ceramic layer side. As a result, in the case where the firing temperature was 975° C., the piezoelectric constants $d_{33}$ were 731 to 783 pm/V, and even when the firing temperature was specified to be 925° C., the piezoelectric constants $d_{33}$ were 716 to 743 pm/V. That is, every piezoelectric constant $d_{33}$ was 700 pm/V or more, and it was made clear that a high piezoelectric constant $d_{33}$ was able to be obtained through low-temperature firing as compared with that in Sample No. 9.

Figure 3:
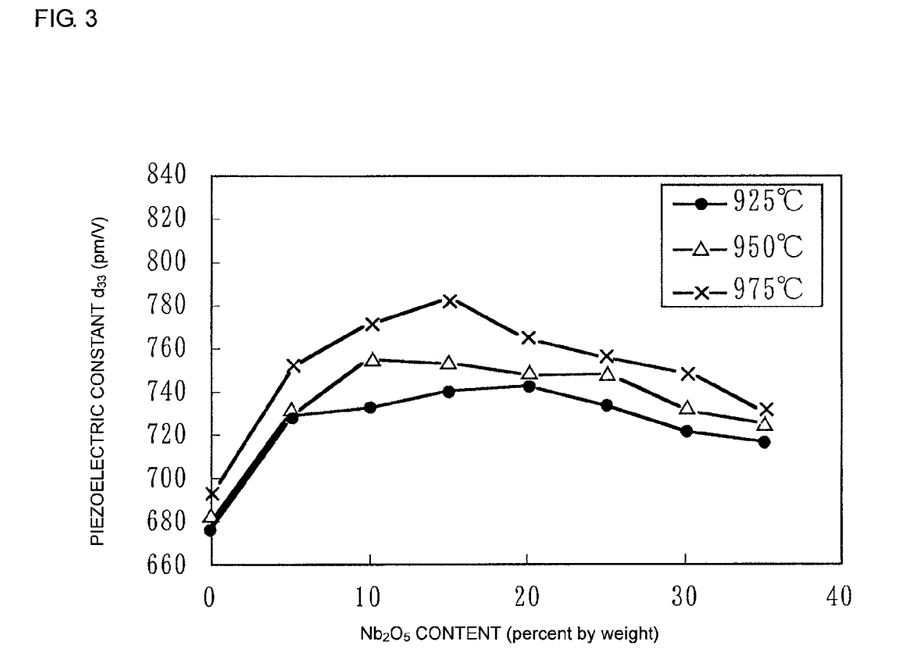
FIG. 3 is a diagram showing the relationship between the piezoelectric constant $d_{33}$ and the $Nb_2O_5$ content relative to a total solid content in an electrically conductive paste in the case where the blend ratio Ag/Pd is specified to be 90/10.

FIG. 3 is a diagram showing the relationship between the $Nb_2O_5$ content and the piezoelectric constant $d_{33}$ regarding Sample Nos. 9 to 16. The horizontal axis indicates the $Nb_2O_5$ content (percent by weight) relative to a total solid content, and the vertical axis indicates the piezoelectric constant $d_{33}$ (pm/V). In the drawing, symbol ● indicates that the firing temperature was 925° C., symbol Δ indicates that the firing temperature was 950° C., and symbol x indicates that the firing temperature was 975° C.

As is clear from FIG. 3, the piezoelectric constant $d_{33}$ increases sharply by allowing the internal electrode pattern to contain merely 5 percent by weight of $Nb_2O_5$ relative to a total solid content. Furthermore, it is clear that when the $Nb_2O_5$ content exceeds 25 percent by weight relative to a total solid content, the piezoelectric constant $d_{33}$ tends to decrease.

In Sample Nos. 17 to 24, the blend ratio, Ag/Pd, of Ag to Pd was specified to be 85/15.

Regarding Sample No. 17, since $Nb_2O_5$ was not contained in the internal electrode pattern, as in Sample Nos. 1 and 9, in the case where the firing temperature was 925° C., the piezoelectric constant $d_{33}$ was a low 679 pm/V, and even when the firing temperature was raised to 975° C., the piezoelectric constant $d_{33}$ was a low 691 pm/V.

On the other hand, regarding Sample Nos. 18 to 24, since 5 to 35 percent by weight of $Nb_2O_5$ was contained in the internal electrode pattern, $Nb_2O_5$ in the internal electrode pattern was diffused to the piezoelectric ceramic layer side. As a result, in the case where the firing temperature was 975° C., the piezoelectric constants $d_{33}$ were 716 to 795 pm/V, and even when the firing temperature was specified to be 925° C., the piezoelectric constants $d_{33}$ were 721 to 744 pm/V. That is, every piezoelectric constant $d_{33}$ was 700 pm/V or more, and it was made clear that a high piezoelectric constant $d_{33}$ was able to be obtained through low-temperature firing as compared with that in Sample No. 9.

Figure 4:
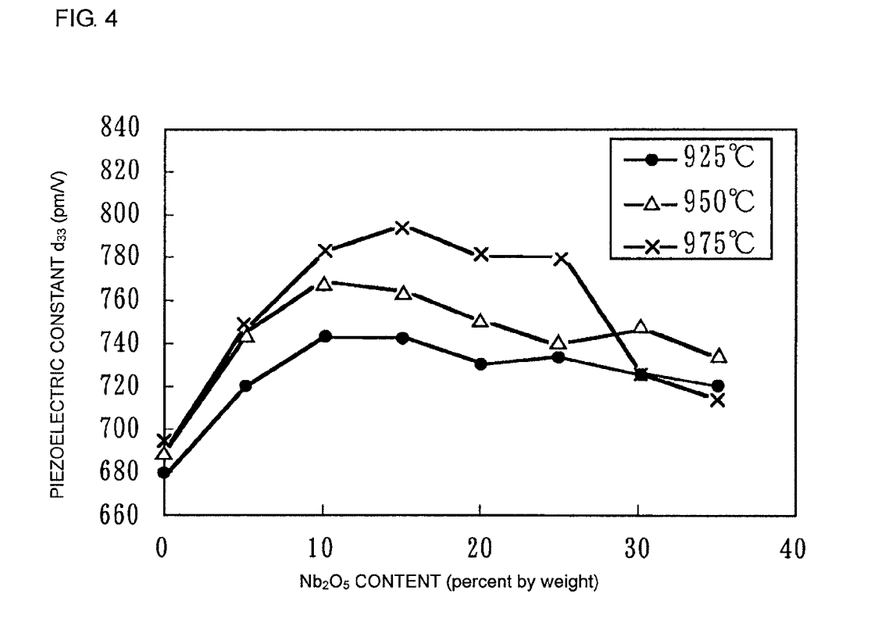
FIG. 4 is a diagram showing the relationship between the piezoelectric constant $d_{33}$ and the $Nb_2O_5$ content relative to a total solid content in an electrically conductive paste in the case where the blend ratio Ag/Pd is specified to be 85/15.

FIG. 4 is a diagram showing the relationship between the $Nb_2O_5$ content and the piezoelectric constant $d_{33}$ regarding Sample Nos. 17 to 24. The horizontal axis indicates the $Nb_2O_5$ content (percent by weight) relative to a total solid content, and the vertical axis indicates the piezoelectric constant $d_{33}$ (pm/V). In the drawing, symbol ● indicates that the firing temperature was 925° C., symbol Δ indicates that the firing temperature was 950° C., and symbol x indicates that the firing temperature was 975° C.

As is clear from FIG. 4, the piezoelectric constant $d_{33}$ increases sharply by allowing the internal electrode pattern to contain merely 5 percent by weight of $Nb_2O_5$ relative to a total solid content. Furthermore, it is clear that when the $Nb_2O_5$ content exceeds 25 percent by weight relative to a total solid content, the piezoelectric constant $d_{33}$ decreases.

Figure 5:
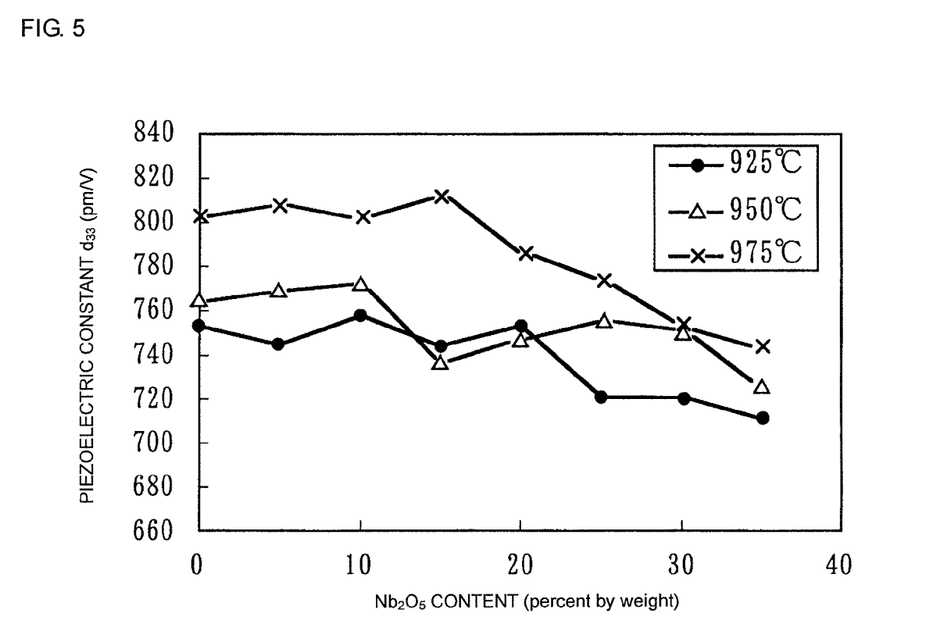
FIG. 5 is a diagram showing the relationship between the piezoelectric constant $d_{33}$ and the $Nb_2O_5$ content relative to a total solid content in an electrically conductive paste in the case where the blend ratio Ag/Pd is specified to be 80/20.

In Sample Nos. 25 to 32, the blend ratio, Ag/Pd, of Ag to Pd was specified to be 80/20. FIG. 5 is a diagram showing the relationship between the $Nb_2O_5$ content and the piezoelectric constant $d_{33}$ regarding Sample Nos. 25 to 32. The horizontal axis indicates the $Nb_2O_5$ content (percent by weight) relative to a total solid content, and the vertical axis indicates the piezoelectric constant $d_{33}$ (pm/V). In the drawing, symbol ● indicates that the firing temperature was 925° C., symbol Δ indicates that the firing temperature was 950° C., and symbol x indicates that the firing temperature was 975° C.

As is clear from FIG. 5 and Table 1, regarding each of Sample Nos. 25 to 32, a large value of 700 pm/V or more of piezoelectric constant $d_{33}$ is exhibited even when $Nb_2O_5$ is not contained in the internal electrode pattern. Therefore, a monolithic piezoelectric element having a desired high piezoelectric constant can be obtained even when $Nb_2O_5$ is not contained in the internal electrode pattern. The reason for this is believed to be that when the Ag content in the Ag—Pd alloy is reduced to about 80 percent by weight, the amount of diffusion of Ag into the piezoelectric ceramic layer is also reduced and deterioration of piezoelectric characteristics under the influence of diffusion of Ag into the piezoelectric ceramic layer is reduced.

However, since the content of expensive Pd is a large 20 percent by weight, there is an economic disadvantage. Therefore, this sample is evaluated as being out of the present invention from the viewpoint of price reduction.

Although not shown in Table 1, in the case where the $Nb_2O_5$ content was 40 percent by weight relative to a total solid content, the piezoelectric constant $d_{33}$ was not able to be measured. The reason for this is believed to be that when the $Nb_2O_5$ content increased to 40 percent by weight, the Ag content decreased excessively and, thereby, the electrical connectivity between the external electrode and the internal electrode layer deteriorated.

Consequently, it was made clear that the monolithic piezoelectric element having a high piezoelectric constant, that is, a piezoelectric constant $d_{33}$ of 700 pm/V or more, was able to be obtained through firing at a low temperature of 925° C. in the region in which the blend ratio, Ag/Pd, of Ag to Pd was 95/5 to 85/15 by allowing the internal electrode pattern to contain 5 to 35 percent by weight of $Nb_2O_5$ relative to a total solid content.

It was also made clear that the preferable range of the $Nb_2O_5$ content was 5 to 25 percent by weight, and more preferably 10 to 25 percent by weight.

EXAMPLE 2

Figure 6:
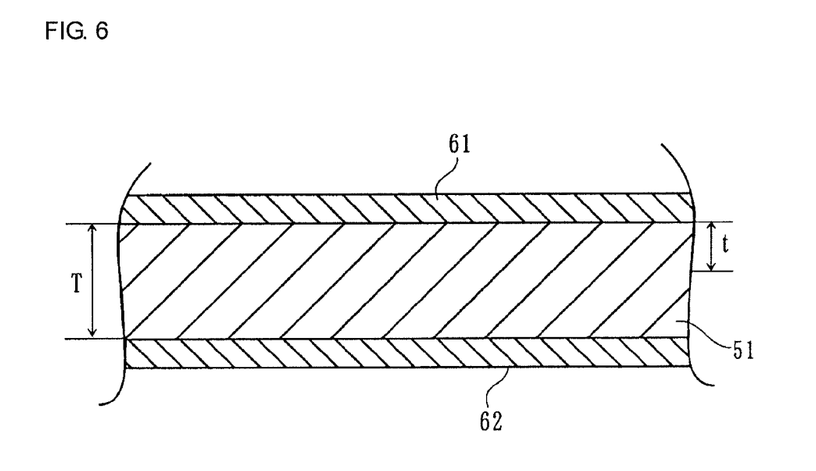
FIG. 6 is a diagram showing the relationship between a piezoelectric ceramic layer and measurement points of $Nb_2O_5$ and Ag in Example 2.

Regarding each of the samples of Sample Nos. 1 to 6 produced in [Example 1], contents (concentrations) of $Nb_2O_5$ and $Ag_2O$ were measured at four places, which were located at different distances t from the internal electrode layer 61, in the piezoelectric ceramic layer 51 (refer to FIG. 6). That is, the concentrations (contents) of $Nb_2O_5$ and $Ag_2O$ were measured at four places, which were located at distances t of 3 μm, 6 μm, 20 μm, and 50 μm from the internal electrode layer 61, in the piezoelectric ceramic layer 51 by using WDX (wavelength dispersive X-ray spectroscope). In this regard, the thickness of the piezoelectric ceramic green sheet is 120 μm, as described above. However, the thickness T per layer of the piezoelectric ceramic layer 51 is reduced to about 100 μm through shrinkage due to firing. Therefore, the place located at a distance of 50 μm from the internal electrode layer 61 is substantially a midpoint between the internal electrode layers 61 and 62.

Table 2 shows the measurement results thereof.

TABLE 2

| Sample No. | $Nb_2O_5$ content (percent by weight) | Measurement point | | |
|---|---|---|---|---|
| | | Distance t from internal electrode layer (μm) | $Nb_2O_5$ concentration (percent by weight) | Ag concentration (percent by weight) |
| 1* | 0 | 3 | 6.0 | 0.1 |
| | | 6 | 6.0 | 0.1 |
| | | 20 | 5.9 | 0.1 |
| | | 50 | 5.9 | 0.1 |
| 2 | 5 | 3 | 6.1 | 0.2 |
| | | 6 | 6.0 | 0.1 |
| | | 20 | 5.9 | 0.1 |
| | | 50 | 5.9 | 0.1 |
| 3 | 10 | 3 | 6.2 | 0.2 |
| | | 6 | 6.1 | 0.2 |
| | | 20 | 6.0 | 0.1 |
| | | 50 | 5.9 | 0.2 |
| 4 | 15 | 3 | 6.3 | 0.2 |
| | | 6 | 6.2 | 0.2 |
| | | 20 | 6.1 | 0.2 |
| | | 50 | 6.0 | 0.2 |
| 5 | 20 | 3 | 6.6 | 0.2 |
| | | 6 | 6.4 | 0.1 |
| | | 20 | 6.2 | 0.0 |
| | | 50 | 6.0 | 0.1 |
| 6 | 25 | 3 | 6.4 | 0.2 |
| | | 6 | 6.5 | 0.2 |
| | | 20 | 6.3 | 0.2 |
| | | 50 | 6.1 | 0.2 |

Asterisked sample number indicates a sample which is out of the present invention Regarding Sample No. 1, $Nb_2O_5$ is not contained in the internal electrode pattern, but a Nb component is contained in the piezoelectric ceramic composition, as shown by the above-described compositional formula (I). Consequently, such a Nb component is almost uniformly contained as $Nb_2O_5$ in the piezoelectric ceramic layer 51. Furthermore, it was made clear that Ag was also uniformly distributed in the piezoelectric ceramic layer 51.

On the other hand, regarding Sample Nos. 2 to 5, since $Nb_2O_5$ is contained also in the internal electrode pattern, $Nb_2O_5$ is diffused from the internal electrode layers 61 and 62 sides into the piezoelectric ceramic layer 51 during firing. As a result, $Nb_2O_5$ is distributed in the piezoelectric ceramic layer in such a way that the $Nb_2O_5$ concentration is high in the vicinity of the internal electrode layer and is reduced with decreasing proximity to the internal electrode layer 61.

Moreover, it was ascertained that since firing was conducted in the oxygen atmosphere, Ag was diffused into the piezoelectric ceramic layer 51 almost uniformly in contrast to that in the case where firing was conducted in a reducing atmosphere.

The invention claimed is:

1. A monolithic piezoelectric element comprising:
   an element assembly in which internal electrode layers and piezoelectric ceramic layers are laminated alternately,
   wherein the internal electrode layers contain an Ag—Pd alloy, which has an Ag content of 85 percent by weight or more as a primary component and a metal element having a valence of at least one of pentavalence or hexavalence,
   the piezoelectric ceramic layers contain (1) a composite oxide represented by $Pb(Ti,Zr)O_3$ as a primary component, (2) diffused AG from a part of the Ag contained in the internal electrode layer, and (3) a diffused metal oxide from the metal element contained in the internal electrode layer, wherein a concentration of the diffused metal oxide reduces with decreasing proximity to the internal electrode layer.

2. The monolithic piezoelectric element according to claim 1, wherein the diffused Ag is substantially uniformly diffused in the piezoelectric ceramic layers.

3. The monolithic piezoelectric element according to claim 1, wherein the metal element is at least one element selected from the group consisting of Nb, Sb, Ta, and W.

4. The monolithic piezoelectric element according to claim 1, wherein an average valence α of the Pb site of the $Pb(Ti,Zr)O_3$ and an average valence β of the (Ti,Zr) site satisfy $$1.95 \leq \alpha \leq 2.05 \text{ and}$$

$$3.95 \leq \beta \leq 4.05,$$

respectively.

5. The monolithic piezoelectric element according to claim 1, wherein the diffused metal oxide is present in one of crystal grain boundaries, crystal triple points, and crystal grains.

6. The monolithic piezoelectric element according to claim 1, wherein the monolithic piezoelectric element has a piezoelectric constant of 700 pm/V or more.

* * * * *